(12) United States Patent
Peng (10) Patent No.: US 12,094,909 B2
(45) Date of Patent: Sep. 17, 2024

(54) CAMERA MODULE AND ELECTRONIC DEVICE HAVING THE CAMERA MODULE

(71) Applicant: TRIPLE WIN TECHNOLOGY(SHENZHEN) CO.LTD., Shenzhen (CN)

(72) Inventor: Shi-Wen Peng, NewTaipei (TW)

(73) Assignee: TRIPLE WIN TECHNOLOGY(SHENZHEN) CO. LTD., Shenzhen (CN)

(*) Notice: Subject to any disclaimer, the term of this patent is extended or adjusted under 35 U.S.C. 154(b) by 471 days.

(21) Appl. No.: 17/538,005

(22) Filed: Nov. 30, 2021

(65) Prior Publication Data
US 2022/0384511 A1  Dec. 1, 2022

(30) Foreign Application Priority Data
May 27, 2021  (CN) .......................... 202121161672.2

(51) Int. Cl.
 *H01L 27/14* (2006.01)
 *H01L 27/146* (2006.01)
 *H04N 23/57* (2023.01)

(52) U.S. Cl.
CPC .. *H01L 27/14636* (2013.01); *H01L 27/14627* (2013.01); *H01L 27/14634* (2013.01); *H04N 23/57* (2023.01)

(58) Field of Classification Search
CPC ......... H01L 27/14636; H01L 27/14627; H01L 27/14634; H04N 23/57; H04N 23/54
See application file for complete search history.

(56) References Cited

U.S. PATENT DOCUMENTS

| | | | | |
|---|---|---|---|---|
| 2014/0043525 | A1* | 2/2014 | Azuma | G03B 3/10 348/357 |
| 2015/0309381 | A1* | 10/2015 | Cai | G02F 1/136286 438/618 |
| 2016/0200264 | A1* | 7/2016 | Bingle | B60R 1/04 348/148 |
| 2017/0310861 | A1* | 10/2017 | Wang | G02B 13/0085 |
| 2018/0007244 | A1* | 1/2018 | Wang | H04N 23/55 |
| 2020/0012081 | A1* | 1/2020 | Komai | G02B 13/0085 |
| 2021/0044681 | A1* | 2/2021 | Park | G06F 1/1652 |
| 2021/0375226 | A1* | 12/2021 | Fujihara | G11C 19/28 |

* cited by examiner

*Primary Examiner* — S M Sohel Imtiaz
(74) *Attorney, Agent, or Firm* — ScienBiziP, P.C.

(57) ABSTRACT

A camera module includes a frame, an optical member, a wiring line, a circuit board, a conductive member, glue, and a blocking member. The frame includes a first connecting end and a second connecting end. The optical member is arranged on the first connecting end, and the optical member includes a light-transmitting area and a non-light-transmitting area. The wiring line is arranged on the non-light-transmitting area. The circuit board is arranged on the second connecting end. One end portion of the conductive member is connected to the circuit board, the other end portion of the conductive member is fixed to the wiring line by a conductive adhesive, thereby forming a connection of the conductive member, the wiring line, and the conductive adhesive. The glue covers the connection. The blocking member is arranged on the non-light-transmitting area, and the blocking member is located between the connection and the light-transmitting area.

16 Claims, 10 Drawing Sheets

CAMERA MODULE AND ELECTRONIC DEVICE HAVING THE CAMERA MODULE

FIELD

The subject matter herein generally relates to a camera module and an electronic device having the camera module.

BACKGROUND

Electronic products (such as mobile phones or tablet computers, etc.) usually contain cameras. The camera includes an optical member (such a lens). Glue is usually used in the camera. However, a fluidity of the glue easily contaminates the optical member, which in turn affects a quality of the camera.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 1:
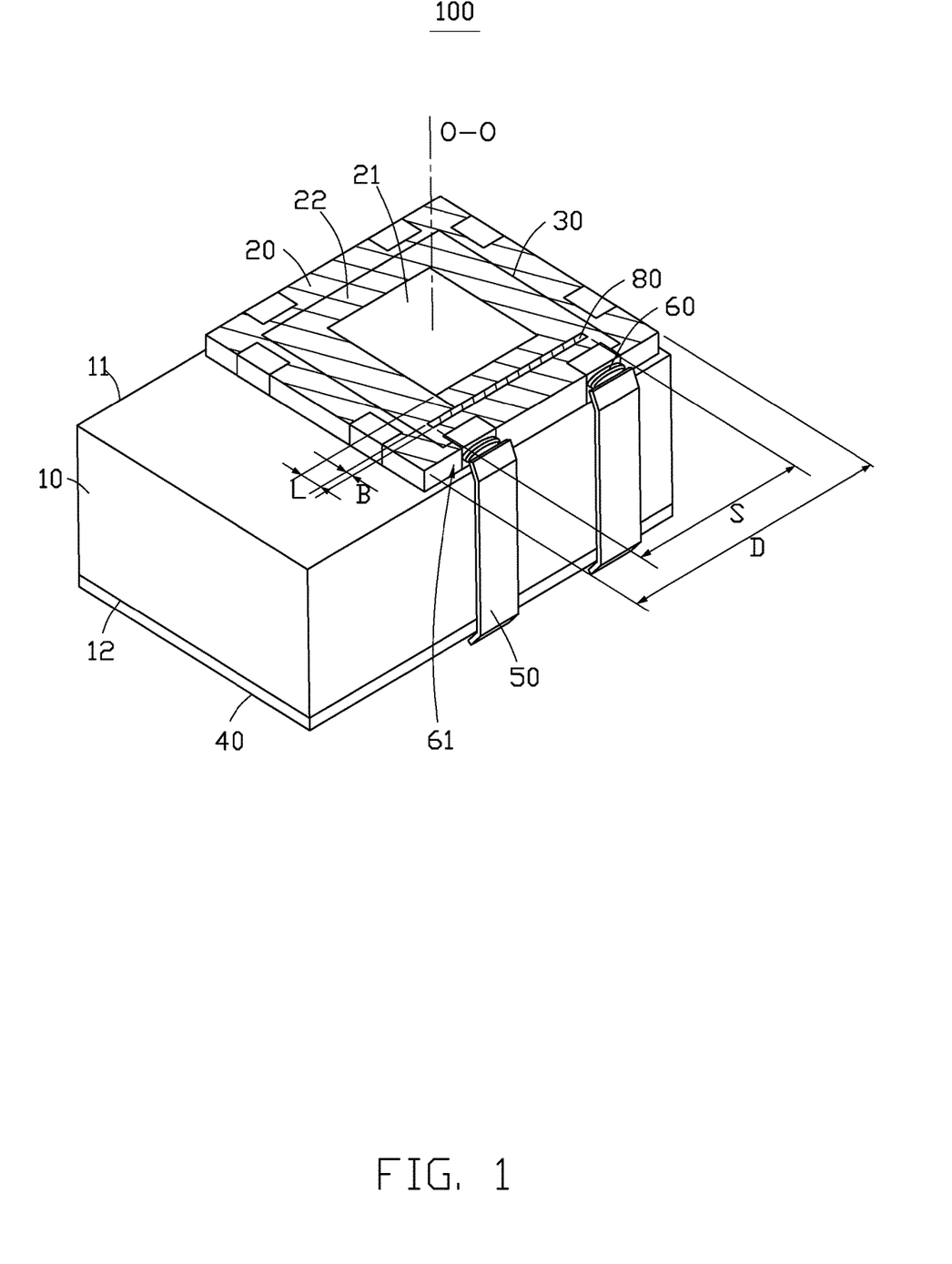
FIG. 1 is a diagram of an embodiment of a camera module according to the present disclosure.
Figure 2:
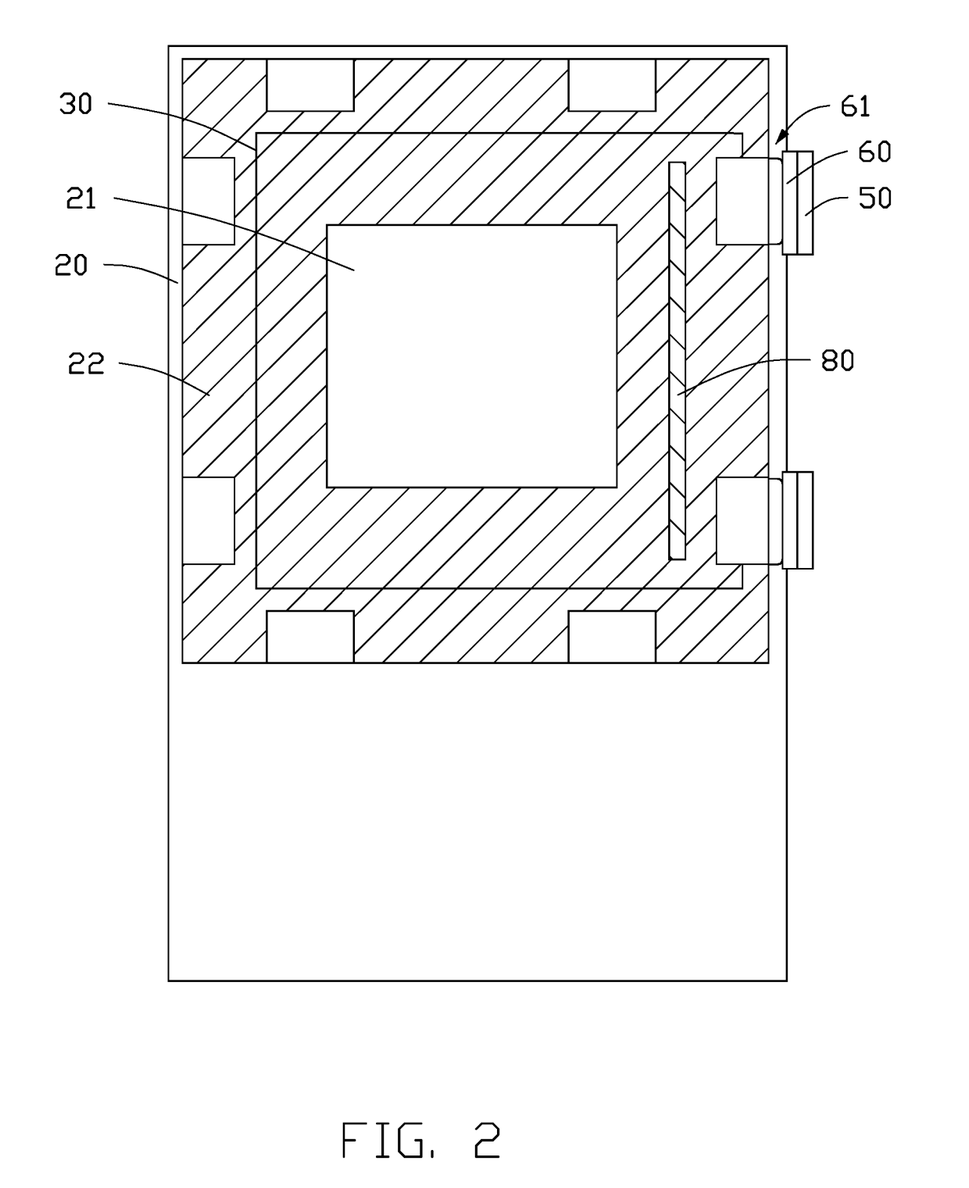
FIG. 2 is a top view of the camera module of FIG. 1.

FIG. 1 illustrates a first embodiment of a camera module 100. Referring to FIGS. 1 and 2, the camera module 100 includes a frame 10, a first optical member 20, a wiring line 30, a circuit board 40, a conductive member 50, a conductive adhesive 60, and a blocking member 80.

The frame 10 includes a first connecting end 11 and a second connecting end 12 facing away from the first connecting end 11. The first optical member 20 is arranged on the first connecting end 11. The first optical member 20 includes a light-transmitting area 21 and a non-light-transmitting area 22. In at least one embodiment, the non-light-transmitting area 22 may surround the light-transmitting area 21. The wiring line 30 is formed on the non-light-transmitting area 22. The circuit board 40 is arranged on the second connecting end 12. One end portion of the conductive member 50 is connected to the circuit board 40. The other end portion of the conductive member 50 is fixed to the wiring line 30 by the conductive adhesive 60, thereby forming a connection 61.

Figure 3:
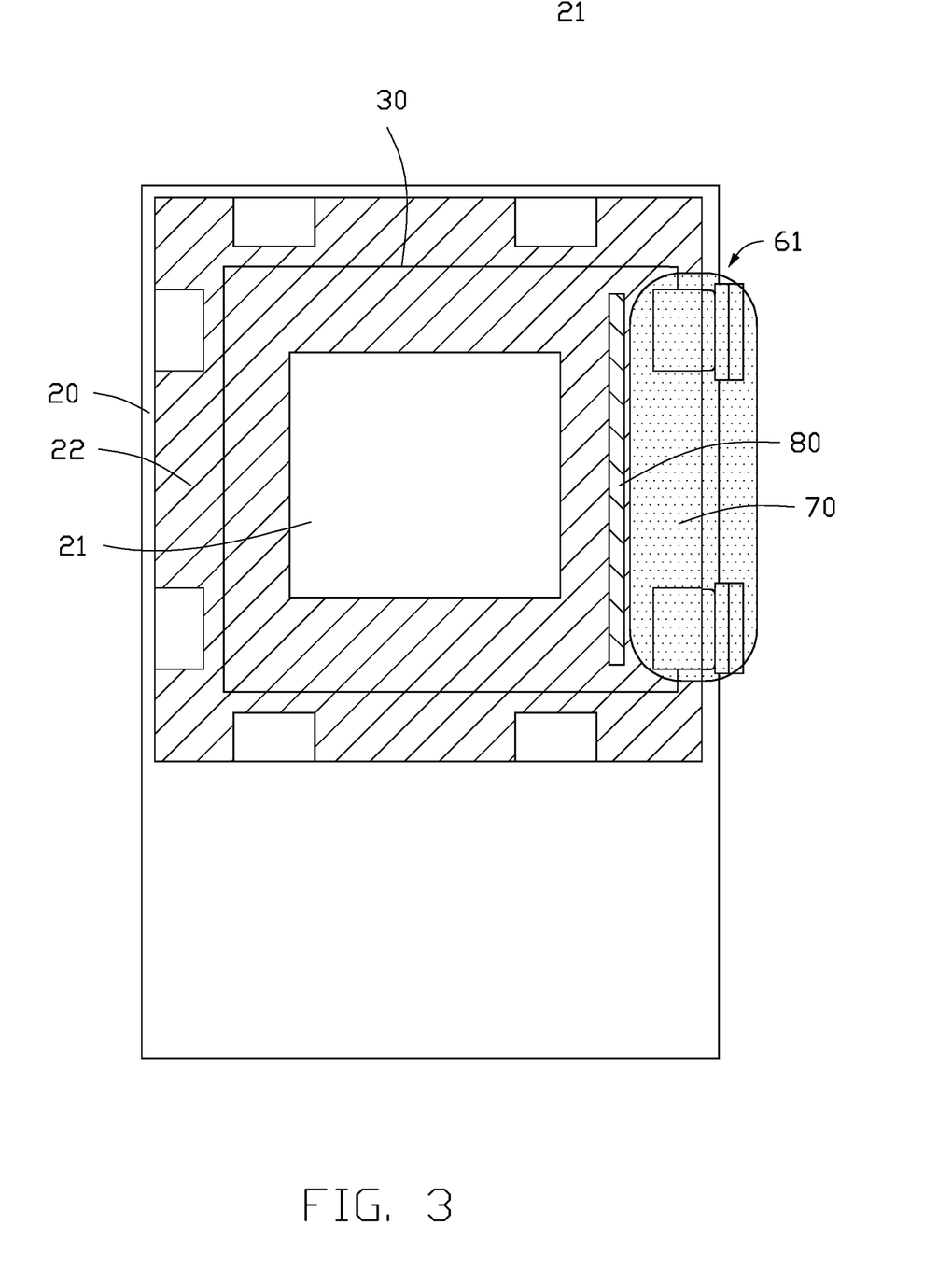
FIG. 3 is a top view of a first embodiment of a camera module according to the present disclosure.

Referring to FIGS. 2 and 3, the camera module 100 further includes glue 70. The glue 70 covers the connection 61 of the conductive member 50, the wiring line 30, and the conductive adhesive 60. The blocking member 80 is formed on the non-light-transmitting area 22 and located between the connection 61 and the light-transmitting area 21 to prevent the glue 70 from flowing into the light-transmitting area 21.

The blocking member 80 restricts the flow of the glue 70 to prevent the glue 70 from flowing into the light-transmitting area 21 to affect a yield of the camera module 100.

In at least one embodiment, the end portion of the conductive member 50 fixed to the wiring line 30 and the wiring line 30 may be on different surfaces of the first optical member 20, respectively.

In at least one embodiment, the glue 70 may be made of conformal coating to improve a moisture-proof, an anti-fouling, a dust-proof and an anti-chemical pollution of each of the conductive member 50, the wiring line 30, and the conductive adhesive 60.

In at least one embodiment, the conductive adhesive 60 is an adhesive with conductivity after curing or drying. The conductive adhesive 60 connect the conductive member 50 and the wiring line 30 together to form an electrical path. The conductive adhesive 60 may be made of conductive silver glue.

In at least one embodiment, the first optical member 20 may be a diffractive optical member. The wiring line 30 may be made of indium tin oxide wires.

A material of the blocking member 80 may be the same with a material of the wiring line 30. For example, the material of the blocking member 80 may be indium tin oxide. Since the indium tin oxide has characteristics of electrical conduction ad optical transparency, influences of the blocking member 80 on the light transmission and appearance of the first optical member 20 can be reduced.

In at least one embodiment, the light-transmitting area 21 may be square. In some embodiments, the light-transmitting area 21 may be circular.

The non-light-transmitting area 22 may be formed by coating a light-shielding film (not shown) on an area of the first optical member 20 to prevent light from passing through.

In at least one embodiment, a projection length of the first optical member 20 along a direction perpendicular to an optical axis O-O of the camera module 100 is defined as D, a projection length S of the blocking member 80 along the direction perpendicular to the optical axis of the camera module 100 may satisfy: 0.5D<S≤D. so that it can be ensured that the blocking member 80 blocks the glue 70 on the non-light-transmitting area 22 from flowing into the light-transmitting area 21.

The blocking member 80 may be elongated, bent, or plate-shaped.

A distance L between the blocking member 80 and the light-transmitting area 21 may satisfy: 200 μm<L≤400 μm, thereby preventing the glue 70 on the non-light-transmitting area 22 from flowing into the light-transmitting area 21.

A width B of the blocking member 80 may satisfy: 1 μm<B≤10 μm.

In at least one embodiment, the camera module 100 may further include a second optical member (not shown). The circuit board 40 is connected to the frame 10 to cooperate with each other to form a cavity (not shown). The second optical member is received in the cavity. In at least one embodiment, the second optical member may be a collimator lens.

Figure 4:
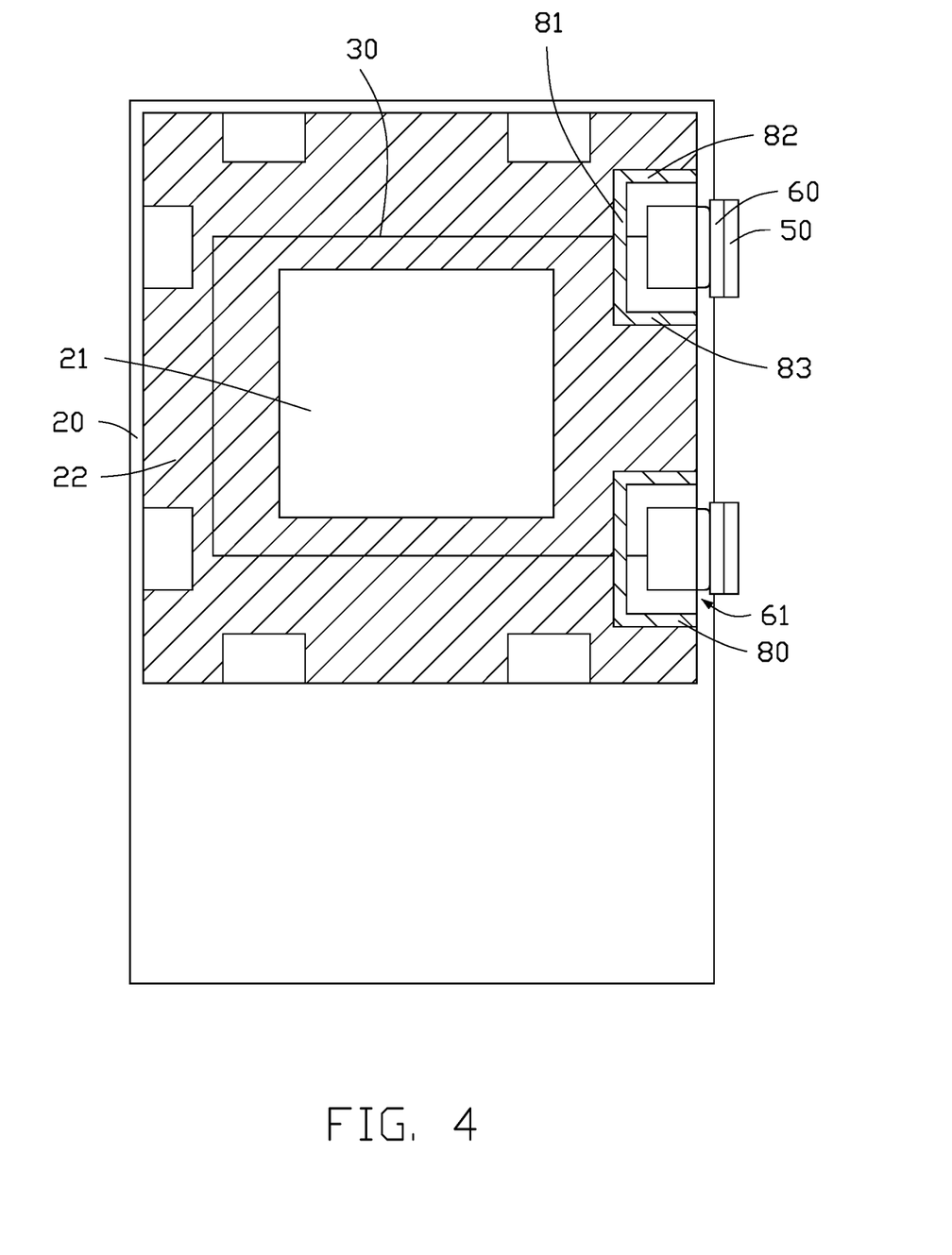
FIG. 4 is a top view of a second embodiment of a camera module without glue according to the present disclosure.
Figure 5:
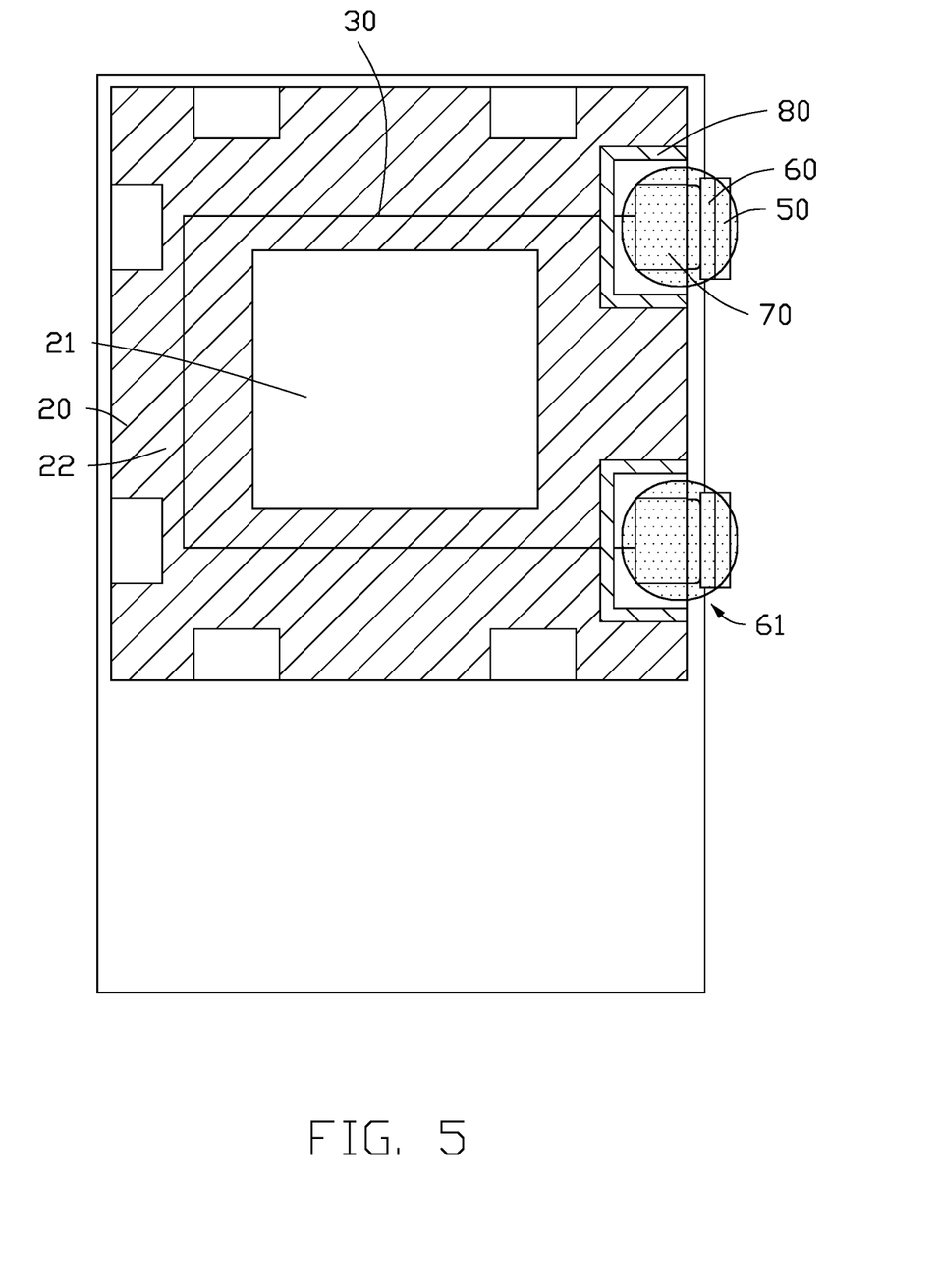
FIG. 5 is a top view of a second embodiment of a camera module according to the present disclosure.

FIG. 5 illustrates a second embodiment of a camera module 100a. Referring to FIGS. 4 and 5, a structure of the camera module 100a is roughly similar to a structure of the camera module 100 of the first embodiment. Different from the first embodiment is a shape of the blocking member 80. In the second embodiment, the blocking member 80 includes a blocking portion 81, a first extending portion 82, and a second extending portion 83. The blocking portion 81 is connected to the first extending portion 82 and the second extending portion 83. The blocking portion 81 is arranged between the connection 61 and the light-transmitting area 21. An end of the first extending portion 82 away from the blocking portion 81 extends in a direction close to the conductive member 50 to an edge of the optical member 20, an end of the second extending portion 83 away from the blocking portion 81 extends in a direction close to the conductive member 50 to the edge of the optical member 20. So that the connection 61 is located in a region enclosed by the blocking portion 81, the first extending portion 82 and the second extending portion 83, and a shape of the glue 70 is restricted by the region.

Figure 6:
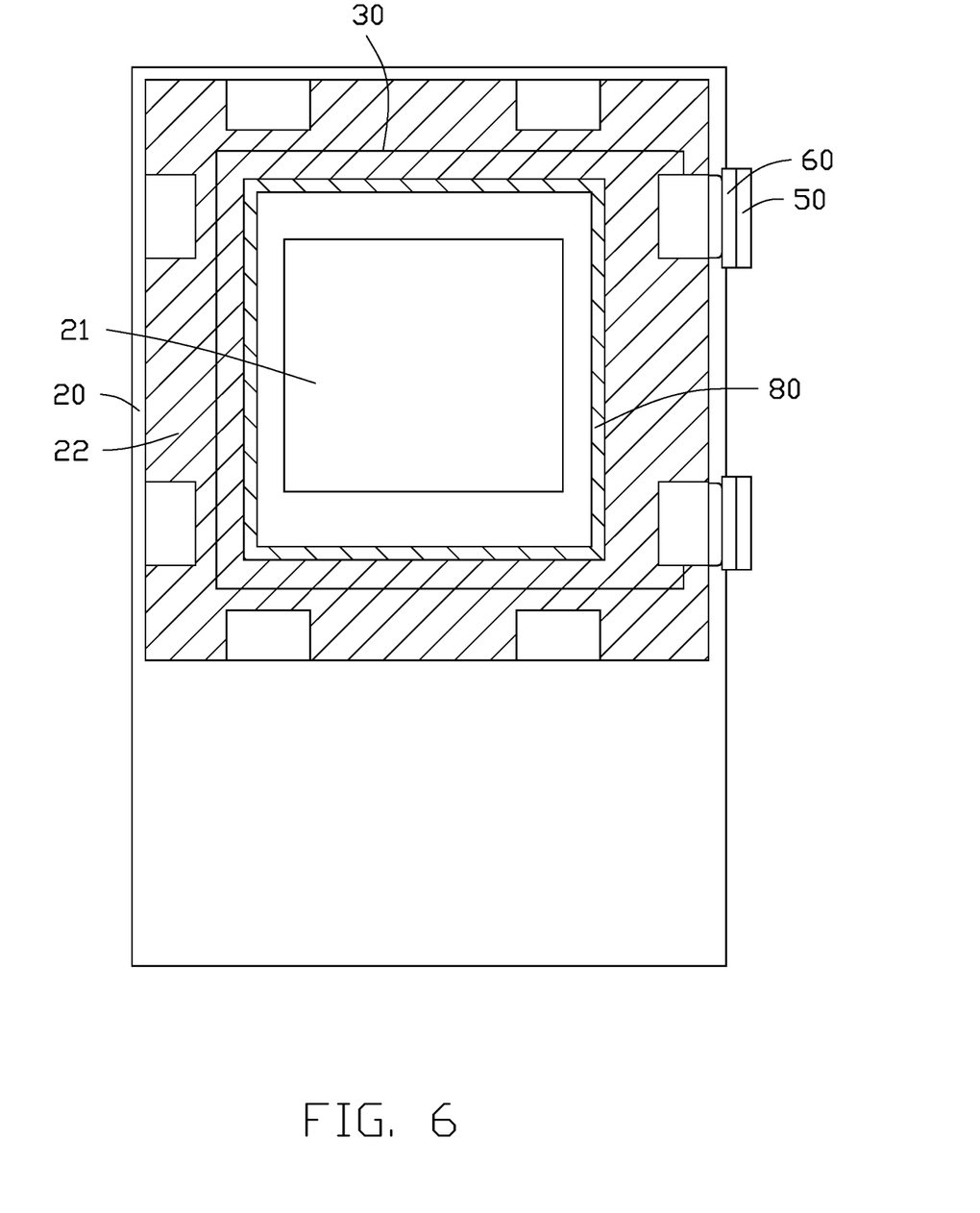
FIG. 6 is a top view of a third embodiment of a camera module without glue according to the present disclosure.
Figure 7:
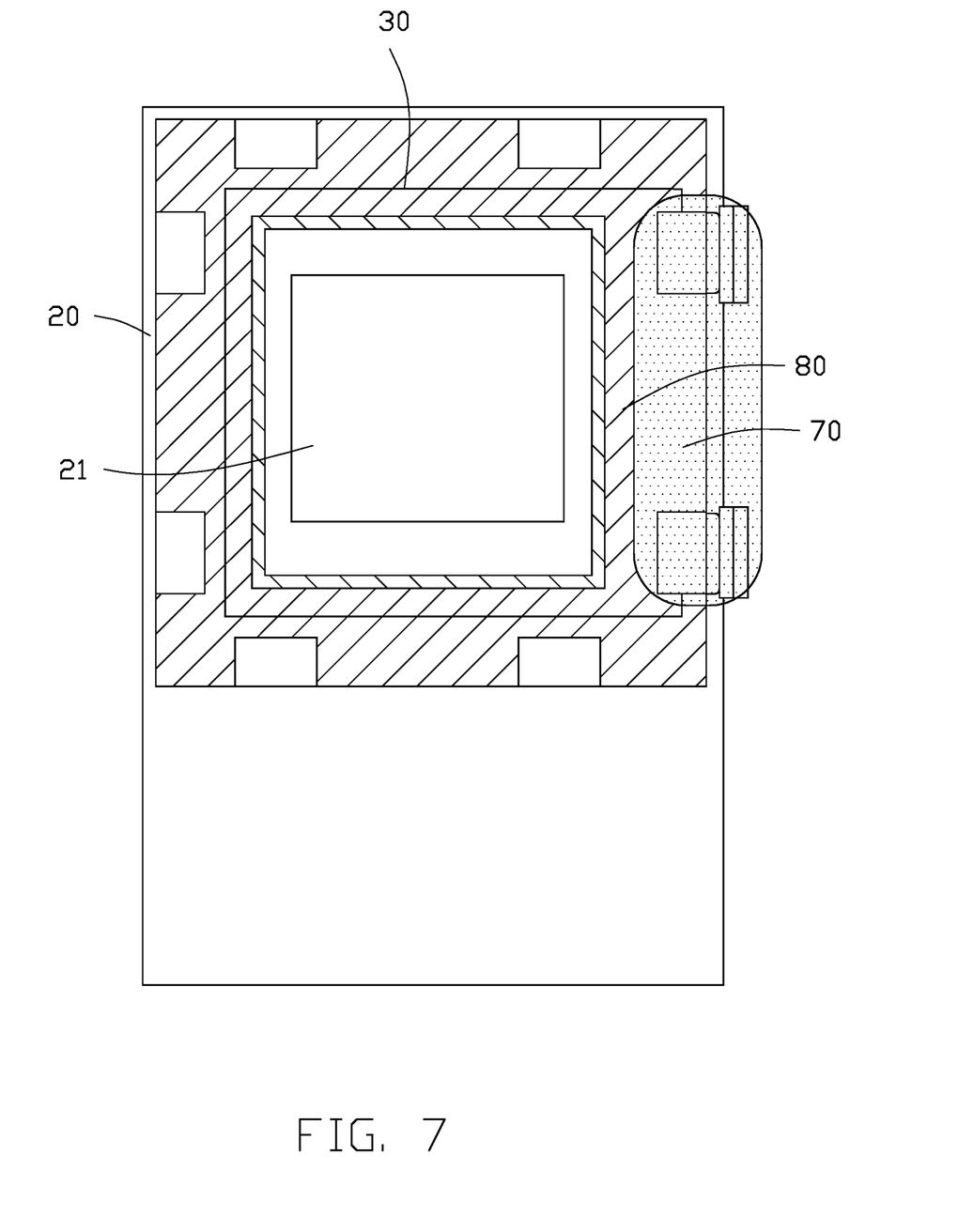
FIG. 7 is a top view of a third embodiment of a camera module according to the present disclosure.

FIG. 7 illustrates a third embodiment of a camera module 100b. Referring to FIGS. 6 and 7, a structure of the camera module 100b is roughly similar to a structure of the camera module 100 of the first embodiment. Different from the first embodiment in that the blocking member 80 is ring-shaped and surrounds the light-transmitting area 21.

Figure 8:
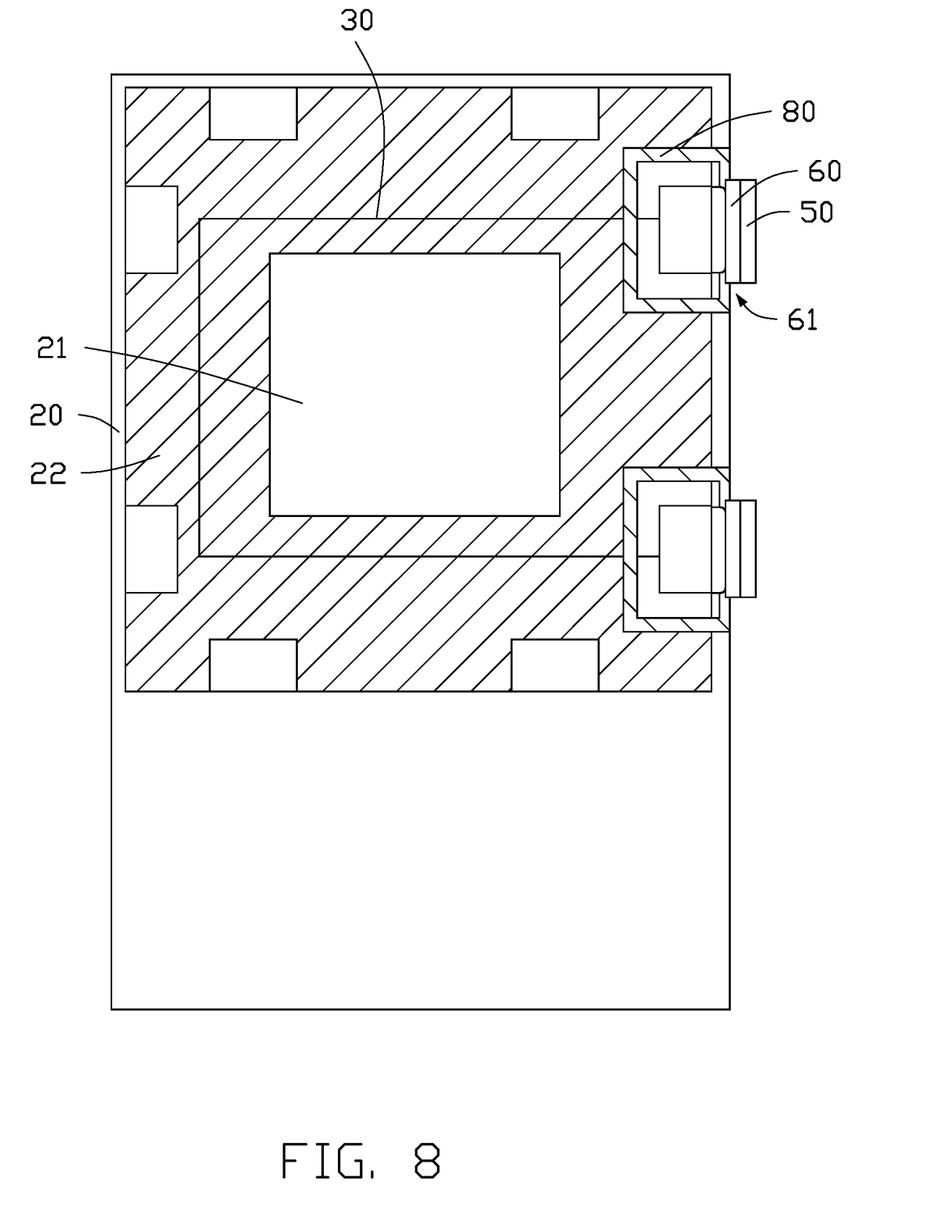
FIG. 8 is a top view of an embodiment of a camera module without glue according to the present disclosure.
Figure 9:
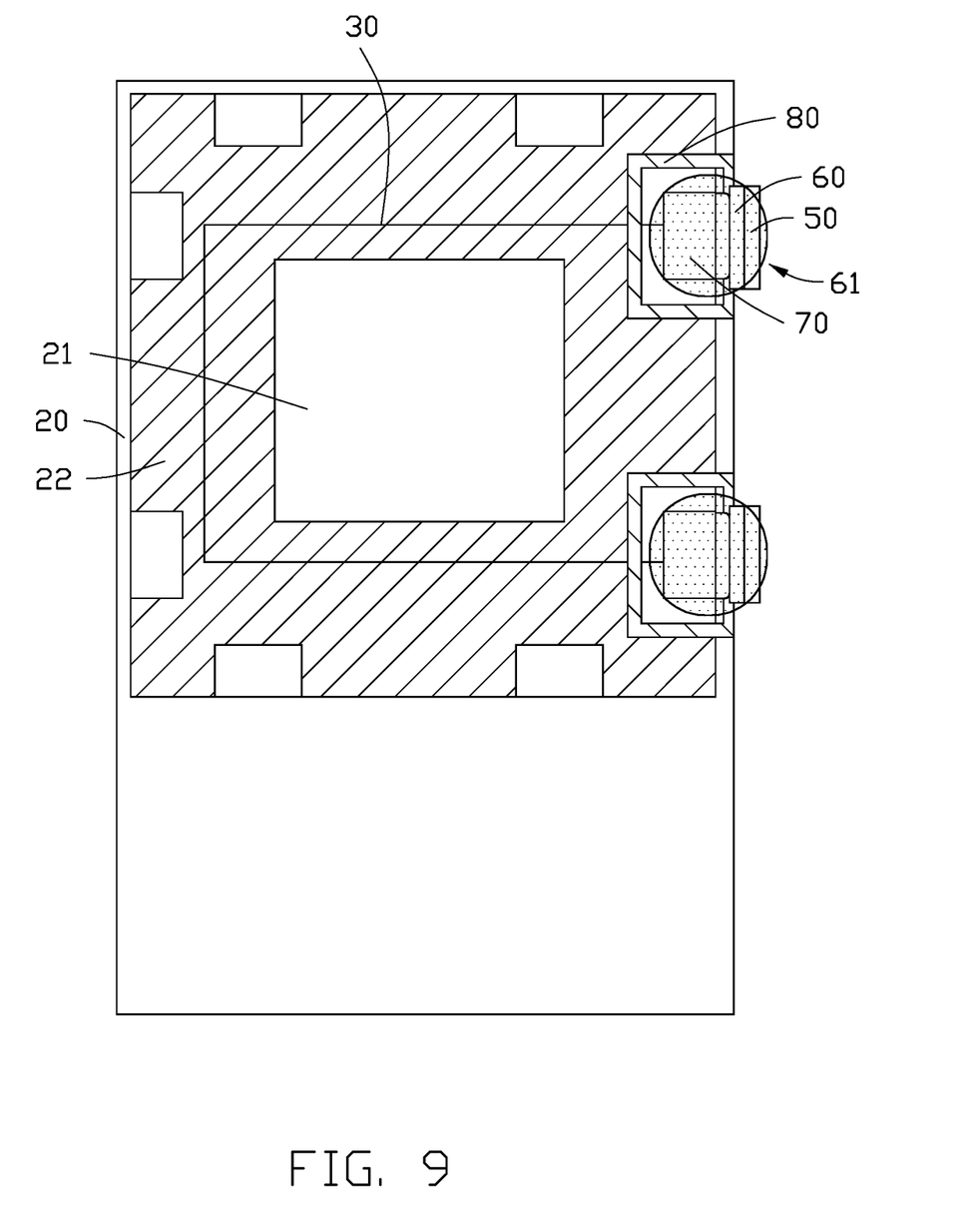
FIG. 9 is a top view of an embodiment of a camera module according to the present disclosure.

In at least one embodiment, referring to FIGS. 8 and 9, the camera module may include at least two conductive members 50 and at least two blocking members 80. Each conductive member 50 is fixed to the wiring line 30 by the conductive adhesive 60 to form one connection 61. Each connection 61 is surrounded by one of the blocking members 80.

Figure 10:
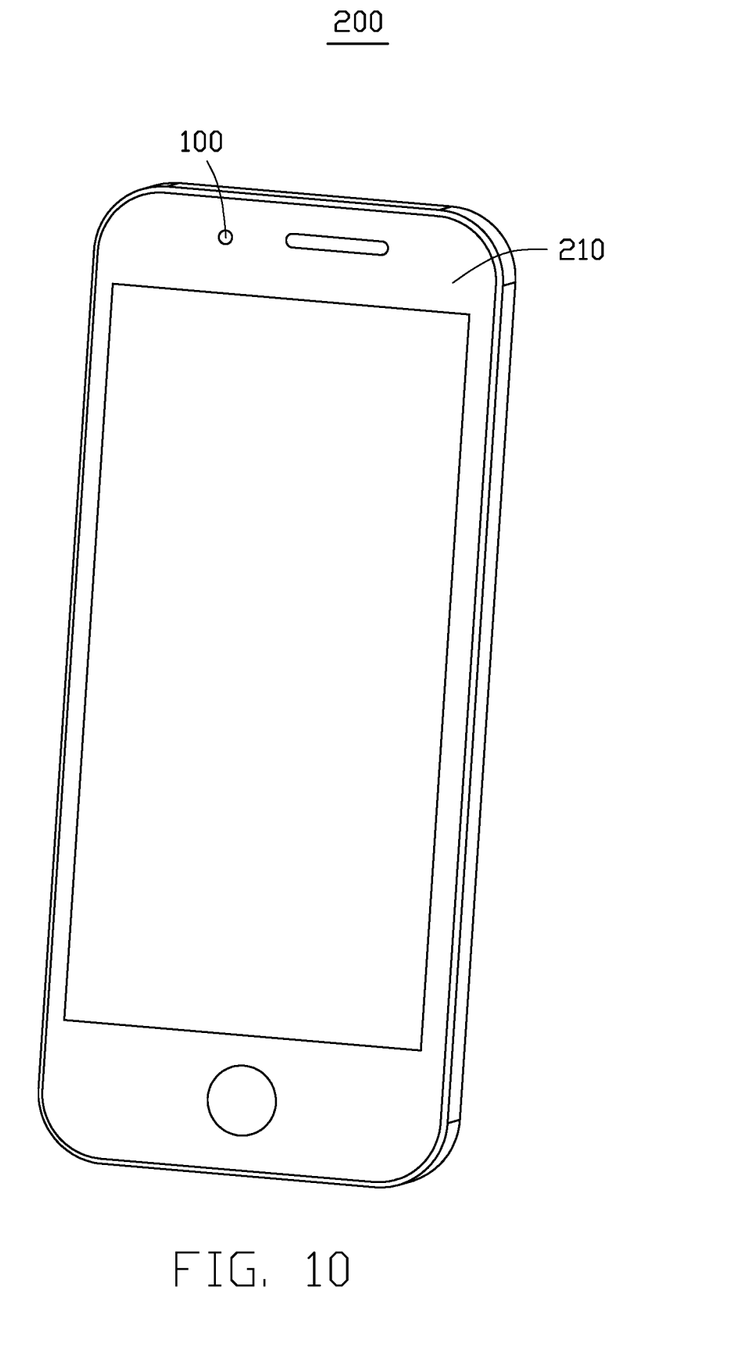
FIG. 10 is a diagram of an embodiment of an electronic device according to the present disclosure.

FIG. 10 illustrates an embodiment of an electronic device 200 including a housing 210 and the above camera module 100 in the housing 210 to obtain images. The electronic device 200 may be, but not limited to, a mobile phone, a portable multimedia player (PMP), a wearable device, a vehicle, or a monitoring device.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A camera module comprising:
   a frame comprising a first connecting end and a second connecting end, the second connecting end facing away from the first connecting end;
   an optical member on the first connecting end, wherein the optical member comprises a light-transmitting area and a non-light-transmitting area;
   a wiring line on the non-light-transmitting area;
   a circuit board on the second connecting end;
   a conductive member, wherein one end portion of the conductive member is connected to the circuit board, the other end portion of the conductive member is fixed to the wiring line by a conductive adhesive, thereby forming a connection of the conductive member, the wiring line, and the conductive adhesive;
   glue covering the connection; and
   a blocking member on the non-light-transmitting area, wherein the blocking member is located between the connection and the light-transmitting area, a distance L between the blocking member and the light-transmitting area satisfies a relationship as follows: 200 μm<L≤400 μm.

2. The camera module of claim 1, wherein the blocking member comprises a blocking portion, a first extending portion, and a second extending portion; the blocking portion is connected to the first extending portion and the second extending portion, and the blocking portion is arranged between the connection and the light-transmitting area; an end of the first extending portion away from the blocking portion extends in a direction close to the conductive member to an edge of the optical member, an end of the second extending portion away from the blocking portion extends in a direction close to the conductive member to the edge of the optical member, thereby surrounding the connection in a region enclosed by the blocking portion, the first extending portion and the second extending portion.

3. The camera module of claim 1, wherein the blocking member is ring-shaped and surrounds the light-transmitting area.

4. The camera module of claim 1, wherein the camera module further comprises an optical axis, a projection length of the optical member along a direction perpendicular to the optical axis is defined as D, a projection length S of the blocking member along a direction perpendicular to the optical axis satisfies a relationship as follows:

0.5D<S≤D.

5. The camera module of claim 1, wherein a width B of the blocking member satisfies a relationship as follows: 1 μm<B≤10 μm.

6. The camera module of claim 1, wherein a material of the blocking member is the same with a material of the wiring line.

7. The camera module of claim 6, wherein the material of the blocking member is indium tin oxide.

8. The camera module of claim 1, wherein the non-light-transmitting area surrounds the light-transmitting area.

9. An electronic device comprising:
   a camera module comprising:

a frame comprising a first connecting end and a second connecting end, the second connecting end facing away from the first connecting end;

an optical member on the first connecting end, wherein the optical member comprises a light-transmitting area and a non-light-transmitting area;

a wiring line on the non-light-transmitting area;

a circuit board on the second connecting end;

a conductive member, wherein one end portion of the conductive member is connected to the circuit board, the other end portion of the conductive member is fixed to the wiring line by a conductive adhesive, thereby forming a connection of the conductive member, the wiring line, and the conductive adhesive;

glue covering the connection; and a blocking member on the non-light-transmitting area, wherein the blocking member is located between the connection and the light-transmitting area, a distance L between the blocking member and the light-transmitting area satisfies a relationship as follows: 200 µm<L≤400 µm.

10. The electronic device of claim 9, wherein the blocking member comprises a blocking portion, a first extending portion, and a second extending portion; the blocking portion is connected to the first extending portion and the second extending portion, and the blocking portion is arranged between the connection and the light-transmitting area; an end of the first extending portion away from the blocking portion extends in a direction close to the conductive member to an edge of the optical member, an end of the second extending portion away from the blocking portion extends in a direction close to the conductive member to the edge of the optical member, thereby surrounding the connection in a region enclosed by the blocking portion, the first extending portion and the second extending portion.

11. The electronic device of claim 9, wherein the blocking member is ring-shaped and surrounds the light-transmitting area.

12. The electronic device of claim 9, wherein the camera module further comprises an optical axis, a projection length of the optical member along a direction perpendicular to the optical axis is defined as D, a projection length S of the blocking member along a direction perpendicular to the optical axis satisfies a relationship as follows:

$0.5D<S≤D.$

13. The electronic device of claim 9, wherein a width B of the blocking member satisfies a relationship as follows: 1 µm<B≤10 µm.

14. The electronic device of claim 9, wherein a material of the blocking member is the same with a material of the wiring line.

15. The electronic device of claim 14, wherein the material of the blocking member is indium tin oxide.

16. The electronic device of claim 9, wherein the non-light-transmitting area surrounds the light-transmitting area.

* * * * *